(12) United States Patent
Lee et al.

(10) Patent No.: US 11,631,692 B2
(45) Date of Patent: Apr. 18, 2023

(54) SEMICONDUCTOR MEMORY DEVICE

(71) Applicant: SAMSUNG ELECTRONICS CO., LTD., Suwon-si (KR)

(72) Inventors: Hae Min Lee, Seoul (KR); Shin Hwan Kang, Suwon-si (KR); Jee Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 16/935,306

(22) Filed: Jul. 22, 2020

(65) Prior Publication Data
US 2021/0036013 A1 Feb. 4, 2021

(30) Foreign Application Priority Data

Jul. 29, 2019 (KR) .......................... 10-2019-0091409

(51) Int. Cl.
*H01L 27/11582* (2017.01)
*H01L 27/1157* (2017.01)
*H01L 27/11573* (2017.01)

(52) U.S. Cl.
CPC .. *H01L 27/11582* (2013.01); *H01L 27/11573* (2013.01)

(58) Field of Classification Search
CPC ......... H01L 27/11582; H01L 27/11573; H01L 27/11565; H01L 27/11575; H01L 27/11578; H01L 27/1157
See application file for complete search history.

(56) References Cited

U.S. PATENT DOCUMENTS

| 5,391,501 A | 2/1995 | Usami et al. |
| 6,812,078 B2 | 11/2004 | Borghs et al. |
| 8,325,527 B2 | 12/2012 | Jin et al. |
| 8,476,713 B2 | 7/2013 | Lee et al. |
| 8,680,604 B2 | 3/2014 | Higashi et al. |
| 9,559,116 B2 | 1/2017 | Kim et al. |

(Continued)

FOREIGN PATENT DOCUMENTS

| JP | H 0714028 B2 | 2/1995 |
| JP | H 07183455 A | 7/1995 |

OTHER PUBLICATIONS

Indian Examination report dated Nov. 8, 2021 for corresponding IN 202024021219.

*Primary Examiner* — Mary A Wilczewski
*Assistant Examiner* — Tsz K Chiu
(74) *Attorney, Agent, or Firm* — Lee IP Law, P.C.

(57) ABSTRACT

A semiconductor memory device includes a peripheral logic structure including peripheral circuits on a substrate, a horizontal semiconductor layer extending along a top surface of the peripheral logic structure, a plurality of stack structures arranged on the horizontal semiconductor layer along a first direction, and a plurality of electrode separation regions in each of the plurality of stack structures to extend in a second direction, which is different from the first direction, wherein each of the plurality of stack structures includes a first electrode pad and a second electrode pad on the first electrode pad, the first electrode pad protruding in the first direction beyond the second electrode pad by a first width, and the first electrode pad protrudes in the second direction beyond the second electrode pad by a second width, which is different from the first width.

17 Claims, 13 Drawing Sheets

(56) References Cited

U.S. PATENT DOCUMENTS

| | | | |
|---|---|---|---|
| 9,691,782 B1* | 6/2017 | Hwang | H01L 27/11573 |
| 10,026,747 B2 | 7/2018 | Hwang et al. | |
| 10,050,055 B2 | 8/2018 | Shimura | |
| 10,249,640 B2* | 4/2019 | Yu | H01L 27/11573 |
| 10,269,620 B2* | 4/2019 | Yu | H01L 27/11575 |
| 10,553,604 B2* | 2/2020 | Lu | H01L 27/11573 |
| 11,164,886 B2* | 11/2021 | Baek | H01L 23/5283 |
| 2003/0095429 A1* | 5/2003 | Hirose | H01L 27/10882 |
| | | | 257/E21.656 |
| 2017/0179026 A1* | 6/2017 | Toyama | H01L 21/76802 |
| 2017/0179153 A1* | 6/2017 | Ogawa | H01L 27/11524 |
| 2019/0057898 A1* | 2/2019 | Shim | H01L 21/76264 |
| 2019/0172838 A1* | 6/2019 | Jo | H01L 23/53295 |
| 2019/0393238 A1* | 12/2019 | Lim | H01L 27/11582 |
| 2020/0152654 A1* | 5/2020 | Hwang | H01L 27/11578 |
| 2020/0365616 A1* | 11/2020 | Baek | H01L 23/5226 |
| 2021/0193679 A1* | 6/2021 | Kwon | G11C 16/30 |
| 2021/0391348 A1* | 12/2021 | Han | H01L 23/535 |

* cited by examiner

SEMICONDUCTOR MEMORY DEVICE

CROSS-REFERENCE TO RELATED APPLICATION

Korean Patent Application No. 10-2019-0091409, filed on Jul. 29, 2019, in the Korean Intellectual Property Office, and entitled: "Semiconductor Memory Device," is incorporated by reference herein in its entirety.

BACKGROUND

1. Field

The present disclosure relates to a semiconductor memory device, and more particularly, to a three-dimensional (3D) semiconductor memory device including a vertical channel structure with improved reliability and integration density.

2. Description of the Related Art

There is a demand for increasing the integration density of a semiconductor device in order to meet customers' demands of high performance and low price. Since integration density is one of the most important factors for determining the price of a semiconductor device, integration density needs to be increased. The integration density of a two-dimensional (2D) or planar semiconductor device is determined by the area occupied by each unit memory cell and is thus considerably affected by fine pattern-forming technology.

However, since expensive equipment is required for the miniaturization of patterns, there still exists a limit in increasing the integration density of a 2D semiconductor device. Accordingly, a three-dimensional (3D) semiconductor memory device including memory cells that are arranged three-dimensionally has been suggested.

SUMMARY

According to an embodiment of the present disclosure, there is provided a semiconductor memory device including a peripheral logic structure having peripheral circuits on a substrate, a horizontal semiconductor layer extending along a top surface of the peripheral logic structure, a plurality of stack structures arranged on the horizontal semiconductor layer along a first direction and a plurality of electrode separation regions disposed in each of the plurality of stack structures to extend in a second direction, which is different from the first direction, wherein each of the plurality of stack structures includes a first electrode pad and a second electrode pad on the first electrode pad, the first electrode pad protrudes in the first direction beyond the second electrode pad by a first width, and the first electrode pad protrudes in the second direction beyond the second electrode pad by a second width, which is different from the first width.

According to the aforementioned and other embodiments of the present disclosure, there is provided a semiconductor memory device including a peripheral logic structure having first peripheral circuits and second peripheral circuits on a substrate, first and second stack structures arranged on the peripheral logic structure along a first direction, a plurality of electrode separation regions disposed in the first stack structure to extend in a second direction, which is different from the first direction, a plurality of first through electrodes arranged between the first and second stack structures along the first direction to be electrically connected to the first peripheral circuits and a plurality of second through electrodes electrically connected to the second peripheral circuits through the first stack structure and arranged along the second direction, wherein at least one of the plurality of first through electrodes does not penetrate the first and second stack structures.

According to the aforementioned and other embodiments of the present disclosure, there is provided a semiconductor memory device including a peripheral logic structure having first peripheral circuits and second peripheral circuits on a substrate, a horizontal semiconductor layer disposed on the peripheral logic structure, the horizontal semiconductor layer including a plurality of openings which extend in a first direction, first and second stack structures disposed on the horizontal semiconductor layer and arranged in a second direction with one of a plurality of openings interposed therebetween, a plurality of electrode separation regions disposed in the first stack structure to extend in the first direction, a plurality of vertical structures disposed between the electrode separation regions, which are adjacent to one another, to penetrate the first stack structure and to be electrically connected to the horizontal semiconductor layer, bitlines disposed on the first stack structure to extend in the second direction and to be connected to at least one of the plurality of vertical structures, a plurality of first through electrodes penetrating the openings and connecting the bitlines and the first peripheral circuits and a plurality of second through electrodes electrically connected to the second peripheral circuits through the first stack structure.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
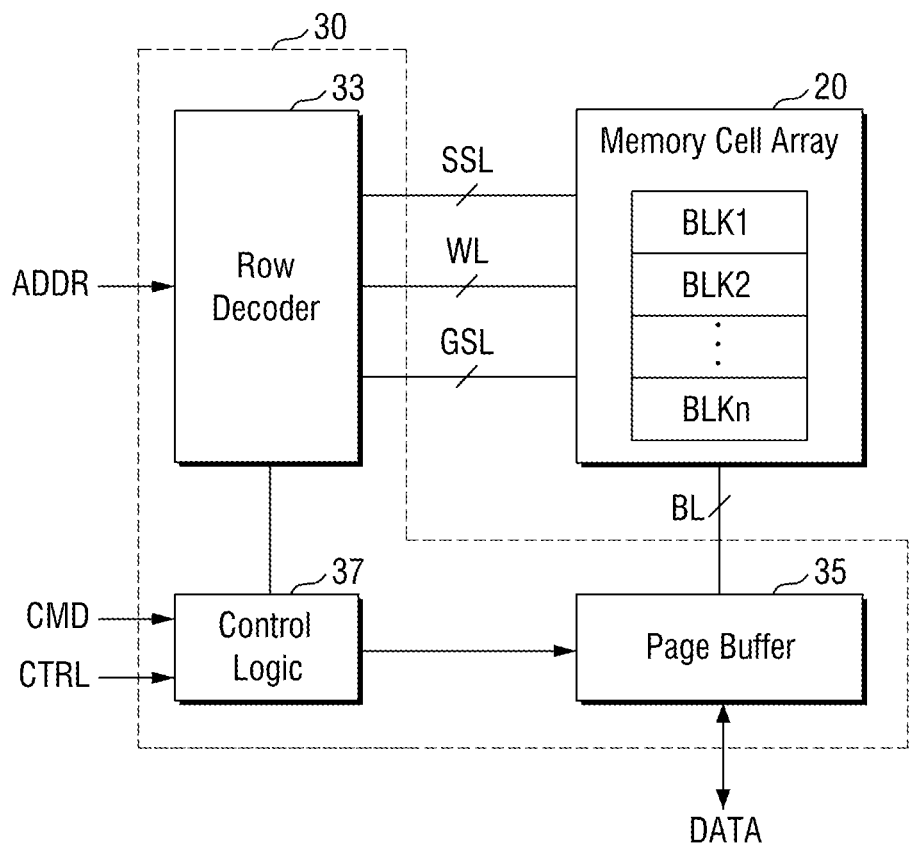
FIG. 1 illustrates a block diagram of a semiconductor memory device according to some embodiments of the present disclosure.

FIG. 1 is a block diagram of a semiconductor memory device according to some embodiments of the present disclosure.

Referring to FIG. 1, a semiconductor memory device 10 may include a memory cell array 20 and a peripheral circuit 30.

The memory cell array 20 may include a plurality of first through n-th memory cell blocks BLK1 through BLKn. Each of the first through n-th memory cell blocks BLK1 through BLKn may include a plurality of memory cells. The first through n-th memory cell blocks BLK1 through BLKn may be connected to the peripheral circuit 30 via bitlines BL, wordlines WL, at least one string selection line SSL, and at least one ground selection line GSL.

In detail, the first through n-th memory cell blocks BLK1 through BLKn may be connected to a row decoder 33 via the wordlines WL, the string selection line SSL, and the ground selection line GSL. Also, the first through n-th memory cell blocks BLK1 through BLKn may be connected to a page buffer 35 via the bitlines BL.

The peripheral circuit 30 may receive an address ADDR, a command CMD, and a control signal CTRL from outside the semiconductor memory device 10 and may exchange data DATA with an external device. The peripheral circuit 30 may include control logic 37, the row decoder 33, and the page buffer 35. The peripheral circuit 30 may further include various sub-circuits such as an input/output (I/O) circuit, a voltage generation circuit for generating various voltages necessary for the operation of the semiconductor memory device 10, and an error correction circuit for correcting error in data DATA read from the memory cell array 20.

The control logic 37 may be connected to the row decoder 33, the voltage generation circuit, and the I/O circuit. The control logic 37 may control the general operation of the semiconductor memory device 10. The control logic 37 may generate various internal control signals for use in the semiconductor memory device 10 in response to the control signal CTRL. For example, the control logic 37 may control the voltages provided to the wordlines WL and the bitlines BL during a memory operation, e.g., a program operation or an erase operation.

The row decoder 33 may select at least one of the first through n-th memory cell blocks BLK1 through BLKn in response to the address ADDR and may select at least one wordline WL, the string selection line SSL, and the ground selection line GSL for the selected memory cell block. The row decoder 33 may provide a voltage for performing a memory operation to the selected wordline WL for the selected memory cell block.

The page buffer 35 may be connected to the memory cell array 20 via the bitlines BL. The page buffer 35 may operate as a write driver or a sense amplifier. In detail, during a program operation, the page buffer 35 may operate as a write driver and may apply, to the bitlines BL, a voltage for data DATA to be written in the memory cell array 20. During a read operation, the page buffer 35 may operate as a sense amplifier and may detect data DATA stored in the memory cell array 20.

Figure 2:
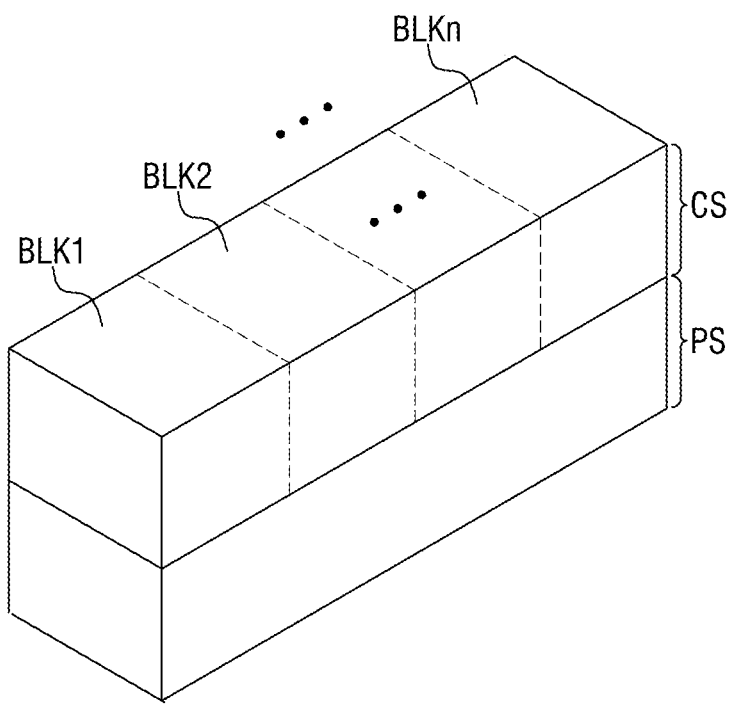
FIG. 2 illustrates a perspective view of a semiconductor memory device according to some embodiments of the present disclosure.

FIG. 2 is a perspective view of a semiconductor memory device according to some embodiments of the present disclosure.

Referring to FIG. 2, the semiconductor memory device may include a peripheral logic structure PS and a cell array structure CS.

The cell array structure CS may be stacked on the peripheral logic structure PS. That is, the peripheral logic structure PS and the cell array structure CS may overlap with each other in a plan view. The semiconductor memory device may have a Cell-Over-Peri (COP) structure.

For example, the cell array structure CS may include the memory cell array 20 of FIG. 1. The peripheral logic structure PS may include the peripheral circuit 30 of FIG. 1. The cell array structure CS may include the first through n-th memory cell blocks BLK1 through BLKn, which are disposed on the peripheral logic structure PS.

Figure 3:
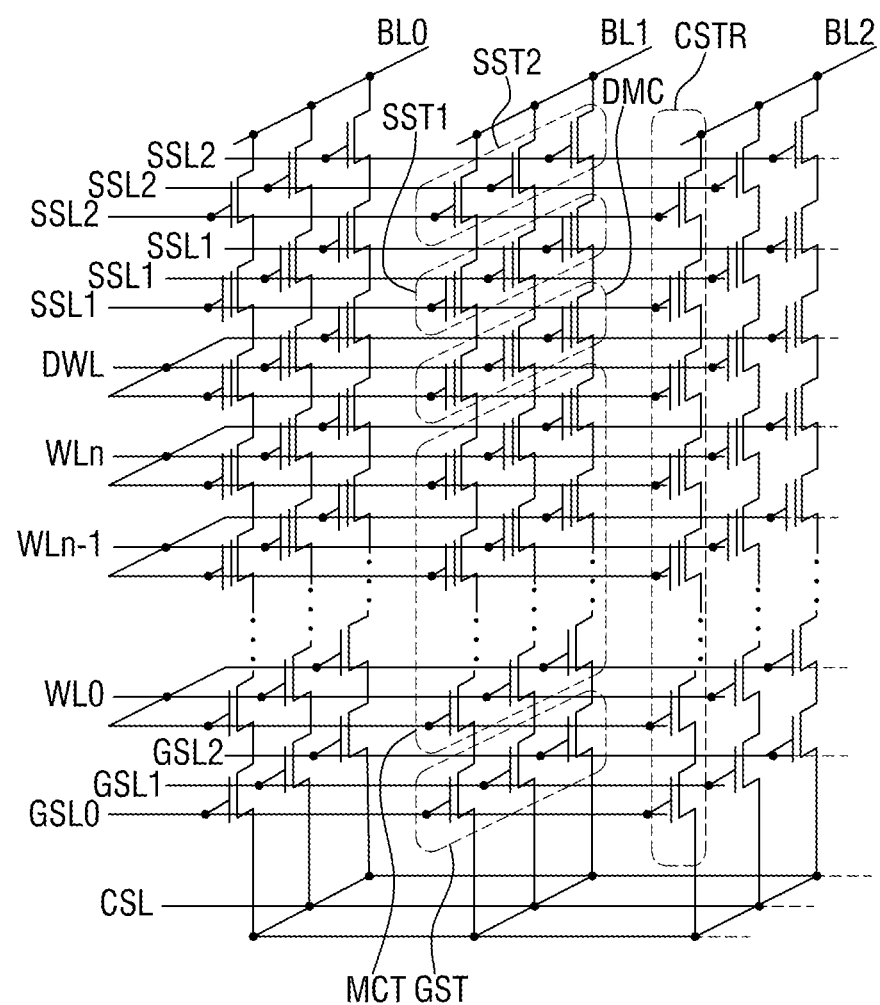
FIG. 3 illustrates a circuit diagram of a memory cell block included in a semiconductor memory device according to some embodiments of the present disclosure.

FIG. 3 is a circuit diagram illustrating a memory cell block included in a semiconductor memory device according to some embodiments of the present disclosure.

Referring to FIG. 3, the memory cell block may include a common source line CSL, a plurality of zeroth through second bitlines BL0 through BL2, and a plurality of cell strings CSTR which are disposed between the common source line CSL and the zeroth through second bitlines BL0 through BL2.

The cell strings CSTR may be connected in parallel to each of the zeroth through second bitlines BL0 through BL2. The cell strings CSTR may be connected in common to the common source line CSL. That is, the cell strings CSTR may be disposed between the common source line CSL and the zeroth through second bitlines BL0 through BL2. A plurality of common source lines CSL may be arranged two-dimensionally. Here, the same voltage may be applied to the plurality of common source lines CSL, or each of the plurality of common source lines CSL may be electrically controlled.

For example, each of the cell strings CSTR may include first and second string selection transistors SST1 and SST2 which are connected in series, memory cells MCT which are connected in series, and a ground selection transistor GST. Each of the memory cells MCT may include a data storage element.

For example, the second string selection transistor SST2 may be connected to the zeroth through second bitlines BL0 through BL2, and the ground selection transistor GST may be connected to the common source line CSL. The memory cells MCT may be connected in series between the first string selection transistor SST1 and the ground selection transistor GST.

Each of the cell strings CSTR may further include dummy cells DMC which are connected between the first string selection transistor SST1 and the memory cells MCT. Although not specifically illustrated, dummy cells DMC may also be provided, and connected, between the ground selection transistor GST and the memory cells MCT. The ground selection transistor GST, like the first and second string selection transistors SST1 and SST2, may include a plurality of metal-oxide-semiconductor (MOS) transistors which are connected in series. Alternatively, each of the cell strings CSTR may include a single string selection transistor.

The first string selection transistor SST1 may be controlled by the first string selection line SSL1, and the second string selection transistor SST2 may be controlled by the second string selection line SSL2. The memory cells MCT may be controlled by a plurality of zeroth through n-th wordlines WL0 through WLn, and the dummy cells DMC may be controlled by a dummy wordline DWL. The ground selection transistor GST may be controlled by zeroth through second ground selection lines GSL0 through GSL2. The common source line CSL may be connected in common to the sources of the ground selection transistors GST of the cell strings CSTR.

Each of the cell strings CSTR may include a plurality of memory cells MCT which are apart from the common source line CSL by different distances. The zeroth through n-th wordlines WL0 through WLn and the dummy wordline DWL may be disposed between the common source line CSL and the zeroth through second bitlines BL0 through BL2.

The gate electrodes of memory cells MCT apart from the common source line CSL by substantially the same distance may be connected in common to one of the zeroth through n-th wordlines WL0 through WLn or to the dummy wordline DWL and may thus be in an equipotential state. On the contrary, even if the gate electrodes of the memory cells MCT are on substantially the same level as the common source line CSL, the gate electrodes of memory cells MCT in different rows or in different columns can be controlled independently Zeroth through second ground selection lines GSL0 through GSL2 and the first and second string selection lines SSL1 and SSL2 may extend in the same direction as, for example, the zeroth through n-th wordlines WL0 through WLn and the dummy wordline DWL. The zeroth through second ground selection lines GSL0 through GSL2 and the first and second string selection lines SSL1 and SSL2, which are disposed on substantially the same level from the common source line CSL, may be electrically isolated from one another.

Figure 4:
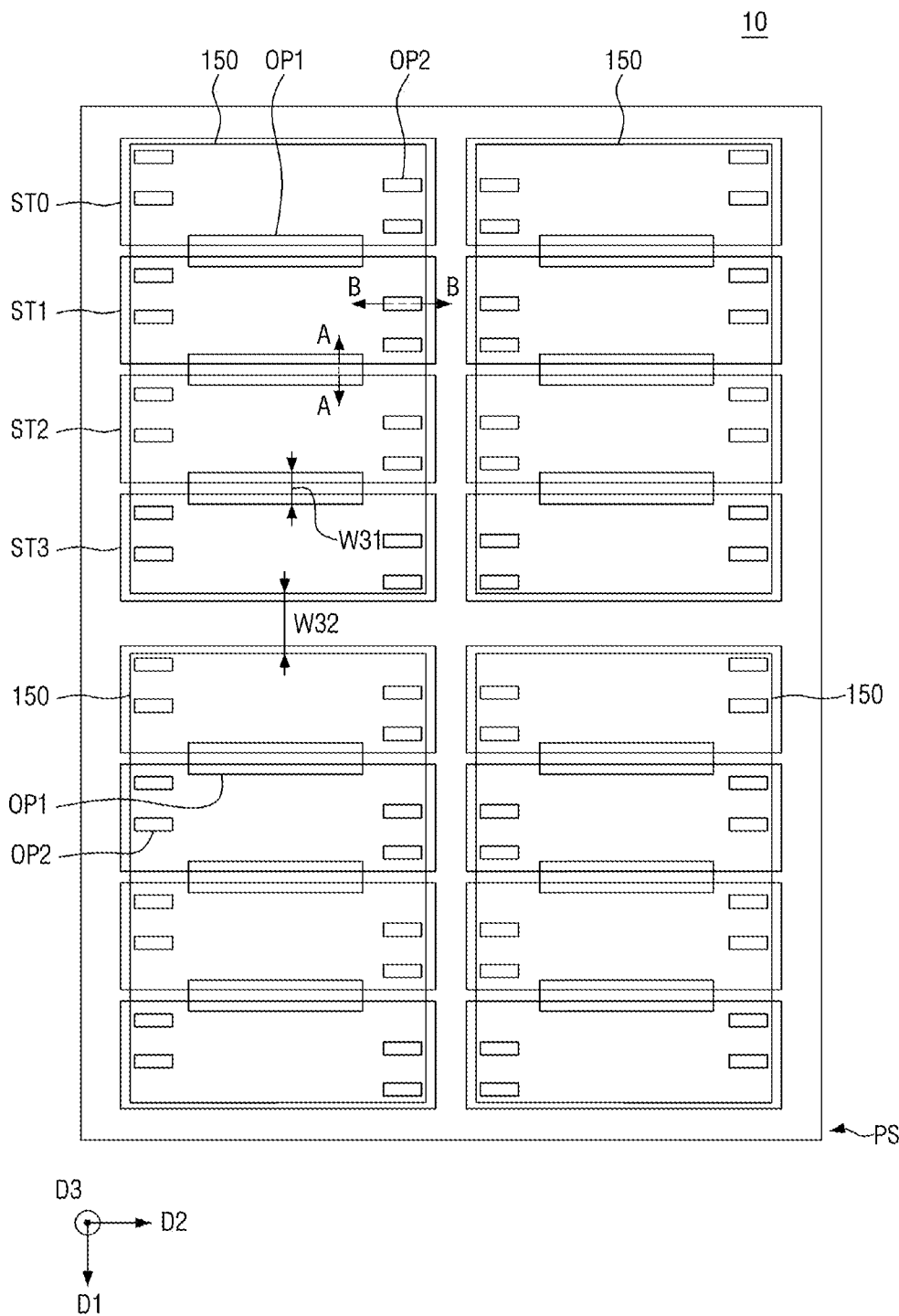
FIG. 4 illustrates a layout view of a semiconductor memory device according to some embodiments of the present disclosure.
Figure 5:
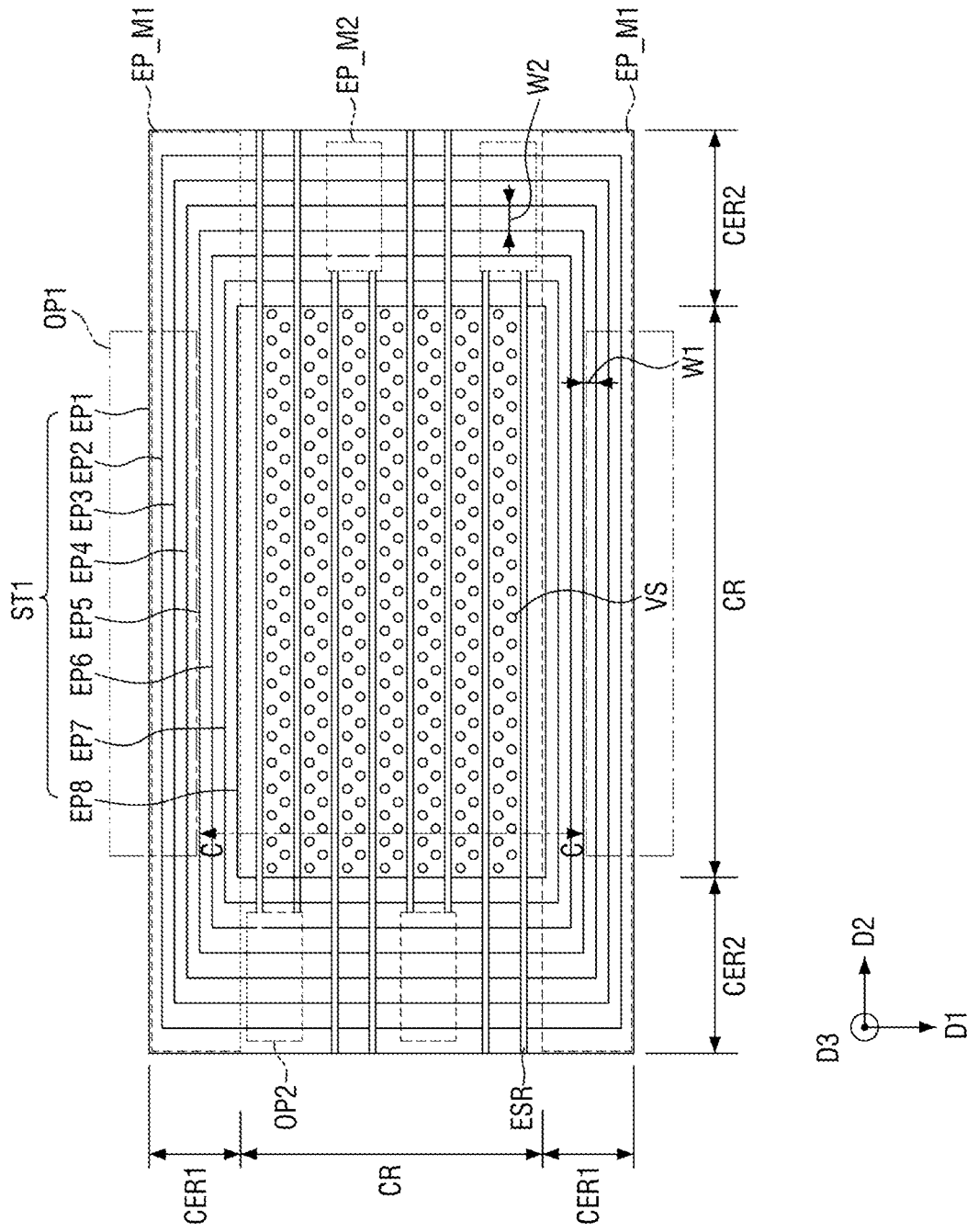
FIG. 5 illustrates a plan view of a first stack structure illustrated in FIG. 4.
Figure 6:
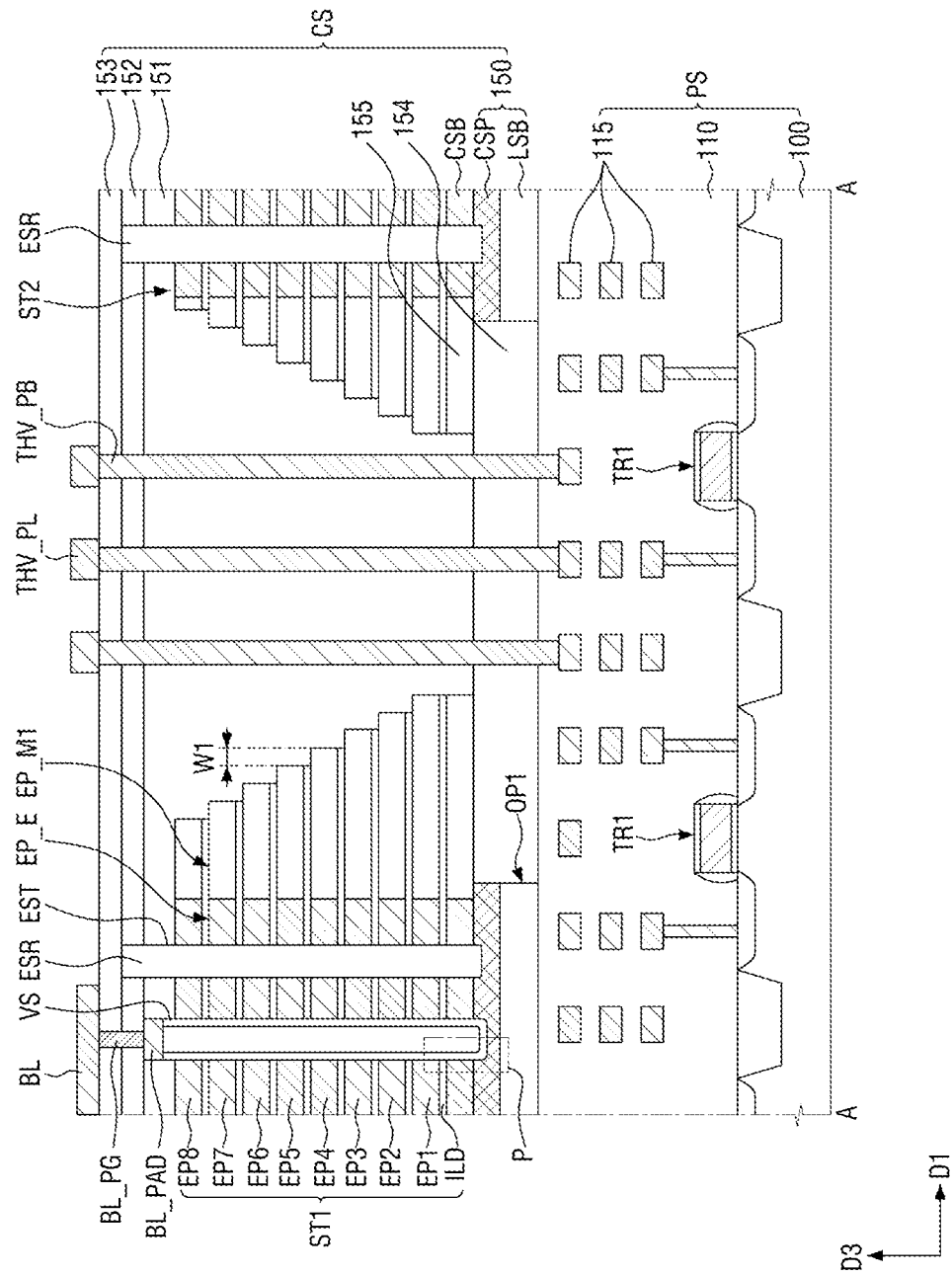
FIG. 6 illustrates a cross-sectional view taken along line A-A of FIG. 4.
Figure 7:
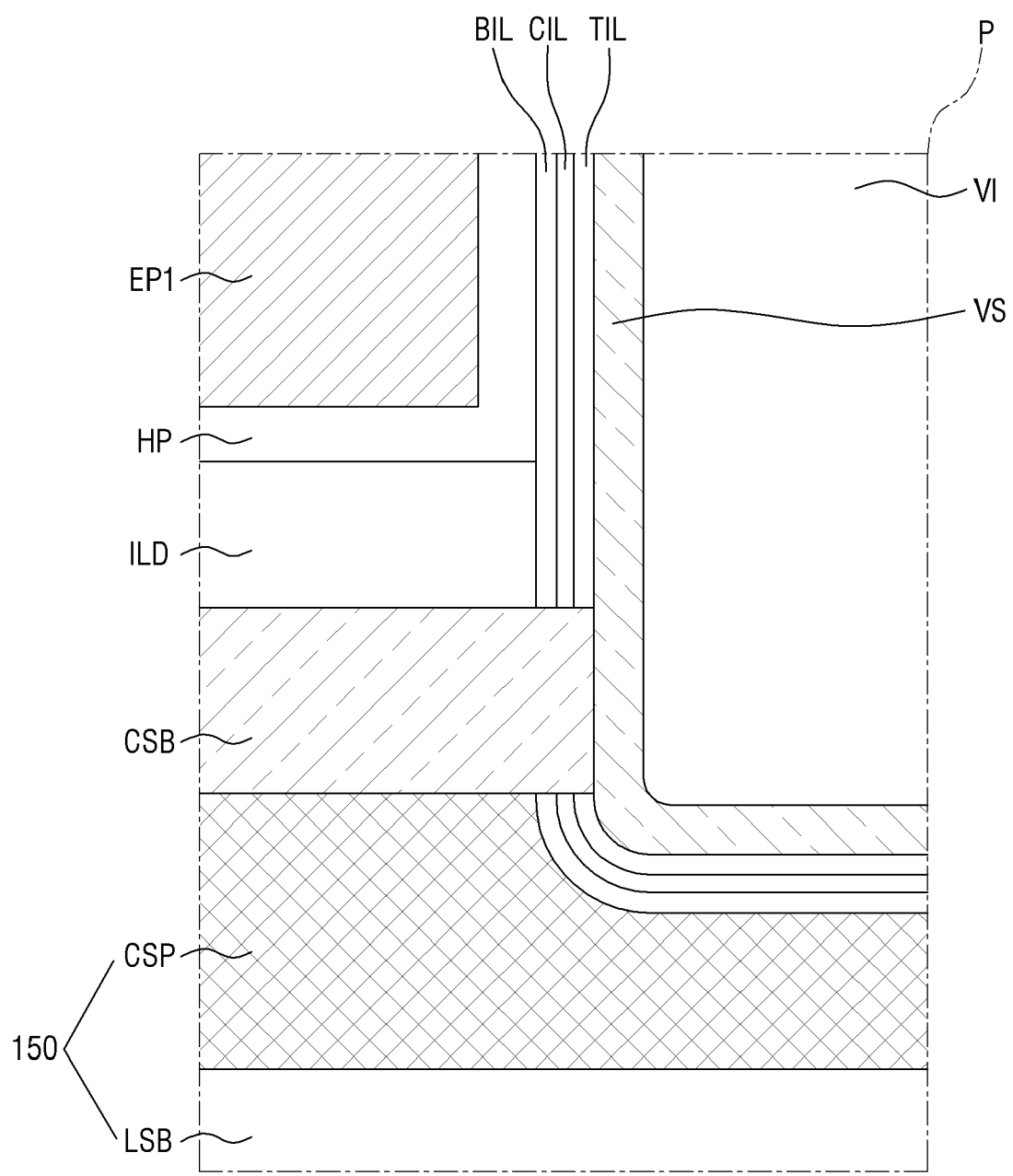
FIG. 7 illustrates an enlarged cross-sectional view of part P of FIG. 6.
Figure 8:
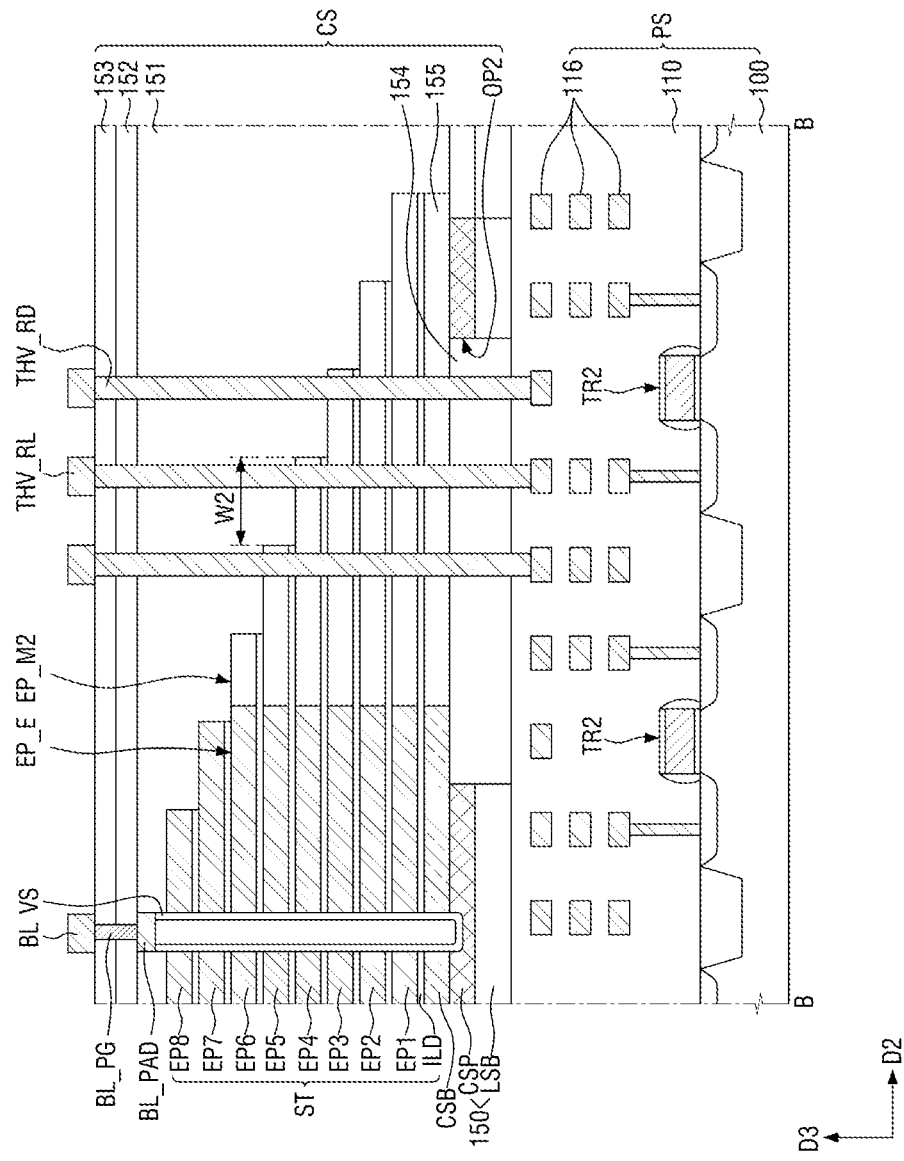
FIG. 8 illustrates a cross-sectional view taken along line B-B of FIG. 4.
Figure 9:
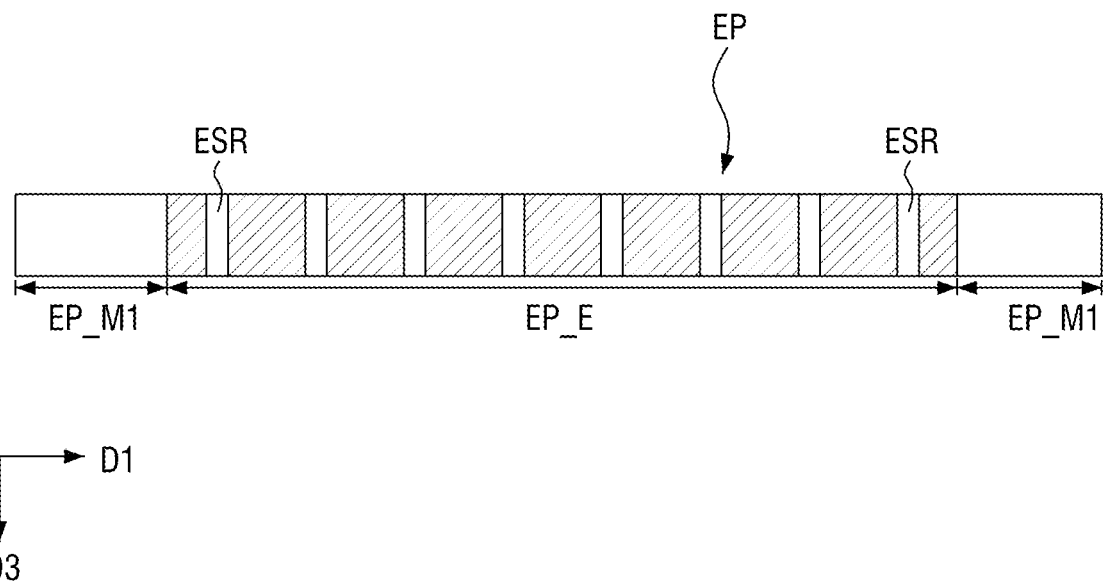
FIG. 9 illustrates a cross-sectional view taken along line C-C of FIG. 5.

FIG. 4 is a layout view of a semiconductor memory device according to some embodiments of the present disclosure. FIG. 5 is a plan view illustrating a first stack structure illustrated in FIG. 4. FIG. 6 is a cross-sectional view taken along line A-A of FIG. 4. FIG. 7 is an enlarged cross-sectional view illustrating part P of FIG. 6. FIG. 8 is a cross-sectional view taken along line B-B of FIG. 4. FIG. 9 is a cross-sectional view, taken along line C-C of FIG. 5, of an electrode pad illustrated in FIG. 5. It is noted that FIG. 9 only illustrates an electrode pad and an electrode separation area.

Referring to FIGS. 4 through 9, the semiconductor memory device 10 may include the peripheral logic structure PS and the cell array structure CS.

The peripheral logic structure PS may include first peripheral circuits TR1, second peripheral circuits TR2, first lower connecting wiring bodies 115, and second lower connecting wiring bodies 116.

The first peripheral circuits TR1 and the second peripheral circuits TR2 may be formed on a substrate 100. The first peripheral circuits TR1 may be included in the page buffer 35 of FIG. 1. The second peripheral circuits TR2 may be included in the row decoder 33 of FIG. 1.

The substrate 100 may be a bulk silicon substrate or a silicon-on-insulator (SOI) substrate. Alternatively, the substrate 100 may be a silicon substrate or may include a material other than silicon, e.g., silicon germanium-on-insulator (SGOI), indium antimonide, a lead tellurium compound, indium arsenide, indium phosphide, gallium arsenide, or gallium antimonide, but the present disclosure is not limited thereto.

A peripheral logic insulating film 110 may be formed on the substrate 100. The peripheral logic insulating film 110 may include at least one of, e.g., silicon oxide, silicon nitride, and silicon oxynitride.

The first lower connecting wiring bodies 115 and the second lower connecting wiring bodies 116 may be formed in the peripheral logic insulating film 110. The first lower connecting wiring bodies 115 may be connected to the first peripheral circuits TR1. The second lower connecting wiring bodies 116 may be connected to the second peripheral circuits TR2.

The cell array structure CS may be on the peripheral logic structure PS, and may include a plurality of horizontal semiconductor layers 150, which are disposed on the peripheral logic structure PS, and a plurality of zeroth through third stack structures ST0 through ST3 which are disposed on each of the horizontal semiconductor layers 150.

The horizontal semiconductor layers 150 may be disposed on the peripheral logic structure PS. The horizontal semiconductor layers 150 may extend along the top surface of the peripheral logic structure PS. For example, as illustrated in FIG. 4, the plurality of horizontal semiconductor layers 150 may be arranged on the top surface of the peripheral logic structure PS to be spaced apart from each other along two directions, e.g., along first and second directions D1 and D2, while each horizontal semiconductor layers 150 may have a longitudinal direction in the first direction D1.

Each of the horizontal semiconductor layers 150 may include a plurality of first openings OP1 and a plurality of second openings OP2. The first openings OP1 and the second openings OP2 may expose parts of the peripheral logic structure PS.

The first openings OP1 in each of the horizontal semiconductor layers 150 may be spaced apart from one another in the first direction D1. The first openings OP1 may extend in the second direction D2, e.g., a longitudinal direction from a top view of each first opening OP1 may extend in the second direction D2.

The horizontal semiconductor layers 150 may be spaced apart from one another in the first direction D1 by a first distance W32. A width W31, in the first direction D1, of the first openings OP1 may be the same as, or smaller than, the first distance W32, but the present disclosure is not limited thereto.

The second openings OP2 may be arranged along first sides of the horizontal semiconductor layers 150 that extend in the first direction D1, e.g., the second openings OP2 may have longitudinal directions along the second direction D2 and may be aligned with each other along each longitudinal side of a corresponding horizontal semiconductor layers 150. The second openings OP2 are illustrated as being formed in a zigzag fashion, but the present disclosure is not limited thereto.

For example, as illustrated in FIG. 6, each of the horizontal semiconductor layers 150 may include a lower support semiconductor layer LSB and a common source plate CSP which is disposed on the lower support semiconductor layer LS. For example, the horizontal semiconductor layer 150 may include at least one of, e.g., silicon (Si), germanium (Ge), silicon germanium (SiGe), gallium arsenic (GaAs), indium gallium arsenic (InGaAs), aluminum gallium arsenic (AlGaAs), or a mixture thereof. The horizontal semiconductor layers 150 may have at least one of, e.g., a monocrystalline structure, an amorphous structure, and a polycrystalline structure. The common source plate CSP may serve as the common source line CSL of FIG. 3.

In another example, each of the horizontal semiconductor layer 150 may include only the common source plate CSP without the lower support semiconductor layer LSB. In yet another example, a common source line that extends in the second direction D2, instead of a two-dimensional (2D)

planar common source plate, may be formed in the horizontal semiconductor layers 150.

The second openings OP2 are illustrated as being surrounded by the corresponding horizontal semiconductor layer 150, but the present disclosure is not limited thereto. That is, sidewalls of the second openings OP2 that extend in the first direction D1 may be open. Accordingly, sides of the horizontal semiconductor layers 150 that extend in the first direction D1 may be uneven.

A filling insulating film 154 may be formed on the peripheral logic structure PS. The filling insulating film 154 may fill the first openings OP1 and the second openings OP2. The filling insulating film 154 may include, e.g., silicon oxide, but the present disclosure is not limited thereto.

The zeroth through third stack structures ST0 through ST3 may be disposed on each of the horizontal semiconductor layers 150. The zeroth through third stack structures ST0 through ST3 may be arranged along the first direction D1, e.g., the zeroth through third stack structures ST0 through ST3 may be adjacent to each other along the first direction D1 on each of the horizontal semiconductor layers 150.

The first openings OP1 may be disposed between the zeroth through third stack structures ST0 through ST3, which are adjacent to one another in the first direction D1. In detail, each of the first openings OP1 may be disposed between the zeroth and first stack structures ST0 and ST1, between the first and second stack structures ST1 and ST2, and between the second and third stack structures ST2 and ST3.

For example, the first and second stack structures ST1 and ST2 may overlap with one of the first openings OP1 in a plan view, but the corresponding first opening OP1 may include parts that do not overlap with the first and second stack structures ST1 and ST2. In another example, at least one of the first and second stack structures ST1 and ST2 may not overlap with one of the first openings OP1 in a plan view.

FIG. 4 illustrates that there are four stack structures disposed on each of the horizontal semiconductor layers 150, but the present disclosure is not limited thereto. That is, two or more stack structures may be provided on each of the horizontal semiconductor layers 150.

The semiconductor memory device according to the present embodiment will hereinafter be described, taking the first stack structure ST1 as an example. The description of the first stack structure ST1 that follows is directly applicable to the zeroth, second, and third stack structures ST0, ST2, and ST3.

Referring to FIGS. 5, 6, and 8, the first stack structure ST1 may include a plurality of first through eighth electrode pads EP1 through EP8 which are stacked in a third direction D3. The first stack structure ST1 may further include an inter-electrode insulating film ILD which is disposed between the first through eighth electrode pads EP1 through EP8, e.g., the inter-electrode insulating film ILD may be between every two adjacent ones of the first through eighth electrode pads EP1 through EP8. The first stack structure ST1 is illustrated as including eight electrode pads, but the present disclosure is not limited thereto.

The first through eighth electrode pads EP1 through EP8, which are stacked in the third direction D3, may include the gate electrodes of the first and second string selection transistors SST1 and SST2 and the ground selection transistor GST of FIG. 3. Also, the first through eighth electrode pads EP1 through EP8, which are stacked in the third direction D3, may include the wordlines of the memory cells MCT of FIG. 3.

For example, the first stack structure ST1 may include the fourth and fifth electrode pads EP4 and EP5, which are adjacent to each other in the third direction D3. The fifth electrode pad EP5 may be disposed on the fourth electrode pad EP4.

The fourth electrode pad EP4 may protrude in the first direction D1 beyond the fifth electrode pad EP5 by a first width W1, as illustrated in FIG. 6. That is, first sidewalls of the fourth and fifth electrode pads EP4 and EP5 that face the second stack structure ST2 may be apart from each other in the first direction D1 by the first width W1.

The fourth electrode pad EP4 may protrude in the second direction D2 beyond the fifth electrode pad EP5 by a second width W2, as illustrated in FIG. 8. That is, second sidewalls of the fourth and fifth electrode pads EP4 and EP5 that face the same stack structure may be apart from each other in the second direction D2 by the second width W2.

The first width W1 may be different from the second width W2. For example, the first width W1 may be smaller than the second width W2.

The first stack structure ST1 may include a cell region CR and a first cell extension region CER1 which extends in the first direction D1 from the cell region CR. For example, as illustrated in FIG. 5, the first cell extension region CER1 may have a longitudinal direction along the second direction D2 to extend along an edge of the cell region CR, e.g., the first cell extension region CER1 may be adjacent to the cell region CR along the first direction D1 (e.g., the first cell extension region CER1 may correspond approximately to the dashed rectangles above and below the cell region CR in FIG. 5). The first stack structure ST1 may further include second cell extension regions CER2 which extend in the second direction D2 from the cell region CR. For example, as illustrated in FIG. 5, the second cell extension regions CER2 may have longitudinal lengths along the first direction D1, such that each second cell extension region CER2 may have the cell region CR along its long side and the first cell extension regions CER1 along its short sides.

A plurality of electrode separation regions ESR may be disposed in the first stack structure ST1. The electrode separation regions ESR may extend in the second direction D2, as viewed in a top view (FIG. 5).

The first stack structure ST1 may include a plurality of electrode separation trenches EST. Each of the electrode separation regions ESR may fill the electrode separation trenches EST. For example, the electrode separation regions ESR may include an insulating material that fills the electrode separation trenches EST. The electrode separation regions ESR may include, e.g., silicon oxide.

In another example, the electrode separation regions ESR may include liners which are formed along the sidewalls of the electrode separation trenches EST and filling films which are formed on the liners to fill the electrode separation trenches EST. For example, the liners may include an insulating material, and the filling films may include a conductive material. In another example, the liners may include a conductive material, and the filling film may include an insulating material.

The length, in the second direction D2, of at least some of the electrode separation regions ESR may be smaller than the length, in the second direction D2, of the first stack structure ST1, as illustrated in FIG. 5. For example, the electrode separation regions ESR may divide the cell region CR in the first direction D1. However, at least some of the electrode separation regions ESR may not divide parts of each of the second cell extension regions CER2 that overlap with second openings OP2, as illustrated in FIG. 5.

The electrode separation regions ESR may not be disposed in the first cell extension region CER1. The electrode separation trench EST with the electrode separation regions ESR formed therein may be used in a replacement process for forming the zeroth through n-th wordlines WL0 through WLn of FIG. 3. That is, parts of a mold film are removed using the electrode separation trenches EST, and the zeroth through n-th wordlines WL0 through WLn are formed in the removed parts of the mold film.

When the mold film is removed using the electrode separation trenches EST, the mold film may not be completely removed from the first cell extension region CER1 and may remain in the first cell extension region CER1. The first cell extension region CER1 may include first mold regions EP_M1 which extend in the second direction D2. That is, the first stack structure ST1 may include first mold region EP_M1 which are disposed on both sides of the cell region CR in the first direction D1.

Each of the first through eighth electrode pads EP1 through EP8 may include an electrode region EP_E and first mold regions EP_M1. The electrode region EP_E may include, e.g., tungsten (W), but the present disclosure is not limited thereto.

For example, referring to FIG. 9, an electrode pad EP may include an electrode region EP_E and first mold regions EP_M1 which are disposed on both sides of the electrode region EP_E in the first direction D1. The electrode region EP_E may be divided by a plurality of electrode separation regions ESR, which extend in the second direction D2. The first mold regions EP_M1 may extend in the first direction D1 from the electrode region EP_E.

The electrode separation regions ESR may include first and second electrode separation regions which are the most distant from each other in the first direction D1. The electrode region EP_E may be disposed between the first and second electrode separation regions. Parts of the electrode region EP_E may be disposed in regions other than the first and second electrode separation regions.

The width, in the first direction D1, of the first mold regions EP_M1 of each of the first through eighth electrode pads EP1 through EP8 may gradually decrease away from the peripheral logic structure PS. For example, the width, in the first direction D1, of the first mold regions EP_M1 of the fourth electrode pad EP4 may be greater than the width, in the first direction D1, of the first mold regions EP_M1 of the fifth electrode pad EP5.

For example, the first mold regions EP_M1 of the fourth electrode pad EP4 may protrude in the first direction D1 from the first mold regions EP_M1 of the fifth electrode pad EP5 by the first width W1, as illustrated in FIG. 6. In other words, sidewalls of first mold regions EP_M1 of the fourth and fifth electrode pads EP4 and EP5 that face the second stack structure ST2 may be apart from each other in the first direction D1 by the first width W1.

In a cross-sectional view taken along the first direction D1, as illustrated in FIG. 6, the first stack structure ST1 may have a stepped profile which is defined by the first mold regions EP_M1 of each of the first through eighth electrode pads EP1 through EP8.

Since at least some of the electrode separation regions ESR do not divide the parts of each of the second cell extension regions CER2 that overlap with the second openings OP2, each of the second cell extension regions CER2 may include second mold regions EP_M2. The second mold regions EP_M2 may at least partially cover the second openings OP2.

For example, as illustrated in FIG. 8, second mold regions EP_M2 of the fourth electrode pad EP4 may protrude in the second direction D2 beyond second mold regions EP_M2 of the fifth electrode pad EP5 by the second width W2. In other words, the second mold regions EP_M2 of the fourth electrode pad EP4 and the second mold regions EP_M2 of the fifth electrode pad EP5 may be apart from each other in the second direction D2 by the second width W2.

That is, in cross-sectional views taken along the first and second directions D1 and D2, as illustrated in FIGS. 6 and 8, the first stack structure ST1 may have a stepped profile in each of the first and second direction D1 and D2, which is defined by the first and second mold regions EP_M1 and EP_M2 of each of the first through eighth electrode pads EP1 through EP8. As further illustrated in FIGS. 4-5, the stepped profile overlaps both edges and an interior area of each of the horizontal semiconductor layers 150. Further, as illustrated in FIGS. 5, 6, and 8, first and second openings OP1 and OP2 in the horizontal semiconductor layer 150 at least partially overlap the stepped portions of the first stack structure ST1 to allow an electrical connection to the peripheral logic structure PS under the horizontal semiconductor layer 150.

The first mold regions EP_M1 and the second mold regions EP_M2 may include, e.g., silicon nitride, but the present disclosure is not limited thereto.

A plurality of vertical structures VS that penetrate the first stack structure ST1 may be disposed between the electrode separation regions ESR. The vertical structures VS may be connected to the horizontal semiconductor layer 150.

For example, some of the vertical structures VS that are used as channel regions of memory cells may be electrically connected to the common source plate CPS of the horizontal semiconductor layer 150. The vertical structures VS may include, for example, a semiconductor material, e.g., Si, Ge, or the mixture thereof. Alternatively, the vertical structures VS may include a metal oxide semiconductor material.

A blocking insulating film BIL, a charge storage film CIL, and a tunnel insulating film TIL may be sequentially disposed between the first stack structure ST1 and the vertical structures VS, but the present disclosure is not limited thereto. A vertical insulating film VI may be disposed on the vertical structures VS. The vertical insulating film VI may fill gaps defined by the vertical structures VS.

A horizontal insulating pattern HP may be disposed between the first electrode pad EP1 and the inter-electrode insulating film ILD and between the first electrode pad EP1 and the blocking insulating film BIL. The horizontal insulating pattern HP may include, e.g., silicon oxide or a high-k dielectric film.

Each of the blocking insulating film BIL, the charge storage film CIL, and the tunnel insulating film TIL may be divided by a contact support film CSB, below the vertical structures VS. The contact support film CSB may electrically connect the common source plate CSP of the horizontal semiconductor layer 150 and the vertical structures VS. The contact support film CSB may include, for example, a semiconductor material, e.g., Si, Ge, or the mixture thereof.

A sacrificial insulating film 155 may be disposed between the first stack structure ST1 and the horizontal semiconductor layer 150, and between the first stack structure ST1 and the filling insulating film 154. The sacrificial insulating film 155 may be in contact with the contact support film CSB. The sacrificial insulating film 155 may serve as a mold for forming the contact support film CSP. The sacrificial insulating film 155 may be part of the mold film that remains unremoved in the process of forming the contact support film CSP. The sacrificial insulating film 155 may include, e.g., silicon nitride, but the present disclosure is not limited thereto.

The first interlayer insulating film 151 may be formed on the horizontal semiconductor layer 150. The first interlayer insulating film 151 may cover the first and second stack structures ST1 and ST2. The first interlayer insulating film 151 may include, e.g., silicon oxide, but the present disclosure is not limited thereto.

Second and third interlayer insulating films 152 and 153 may be sequentially formed on the first interlayer insulating film 151. The electrode isolation regions ESR may extend even to the second interlayer insulating film 152.

Bitlines BL may be disposed on the first stack structure ST1. The bitlines BL may extend in the first direction D1. The bitlines BL may be electrically connected to the vertical structures VS.

The bitlines BL may be formed on the third interlayer insulating film 153. The bitlines BL may be electrically connected to the vertical structures VS via bitline pads BL_PAD and bitline plugs BL_PG.

As illustrated in FIG. 6, a plurality of first through vias THV_PB may be disposed between the first and second stack structures ST1 and ST2, which are adjacent to each other. The first through vias THV_PB may be arranged along the first direction D1, e.g., adjacent to each other along the first direction D1.

The first through vias THV_PB may be electrically connected to the first peripheral circuits TR1 of the peripheral logic structure PS through the first openings OP1. The first through vias THV_PB may be connected to the bitlines BL through a first through via connecting wire THV_PL.

At least one of the first through vias THV_PB, which are arranged along the first direction D1, may not penetrate the first and second stack structures ST1 and ST2. The first through vias THV_PB, which are arranged along the first direction D1, may not penetrate the first and second stack structures ST1 and ST2. That is, the first through vias THV_PB may be electrically connected to the first peripheral circuits TR1 through the space between the first and second stack structures ST1 and ST2.

As illustrated in FIG. 8, a plurality of second through vias THV_RD may be arranged along the second direction D2, e.g., spaced apart from each other along the second direction D2. The second through vias THV_RD may be electrically connected to the second peripheral circuits TR2 of the peripheral logic structures PS through the second openings OP2. The second through vias THV_RD may be electrically connected to the electrode regions EP_E of the first through eighth electrode pads EP1 through EP8 through a second through via connecting wire THV_RL.

The second through vias THV_RD may be electrically connected to the second peripheral circuits TR2 of the peripheral logic structure PS through the first stack structure ST1. The second through vias THV_RD may penetrate the second mold regions EP_M2 of each of the second cell extension regions CER2.

Figure 10:
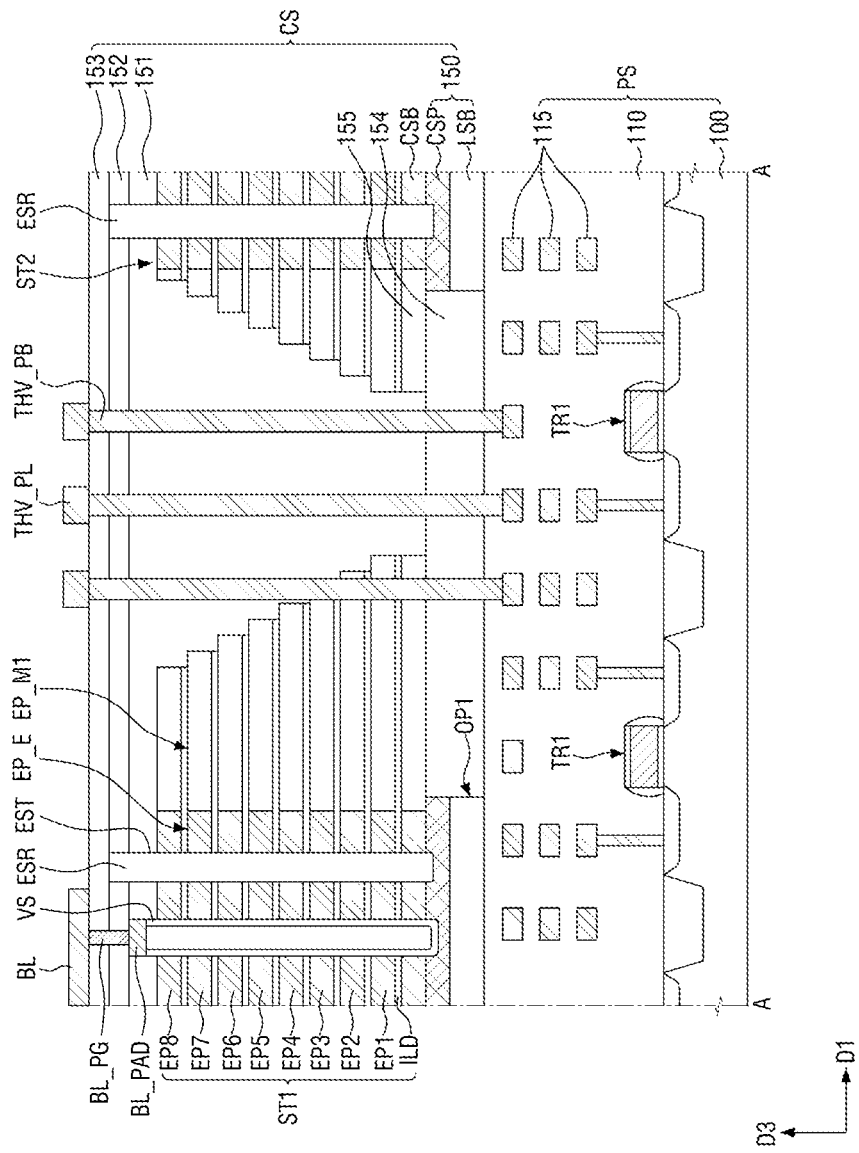
FIG. 10 illustrates a cross-sectional view of a semiconductor memory device according to some embodiments of the present disclosure.

FIG. 10 is a cross-sectional view of a semiconductor memory device according to some embodiments of the present disclosure. The semiconductor memory device of FIG. 10 will hereinafter be described, focusing mainly on the differences with respect to the semiconductor memory device of FIGS. 4 through 9. FIG. 10 corresponds to a cross-sectional view taken along line A-A of FIG. 4.

Referring to FIG. 10, some of the plurality of first through vias THV_PB which are arranged in the first direction D1 may penetrate at last one of first and second stack structures ST1 and ST2, e.g., a most left first through via THV_PB in FIG. 10. The other first through vias THV_PB may not penetrate the first and second stack structures ST1 and ST2.

Figure 11:
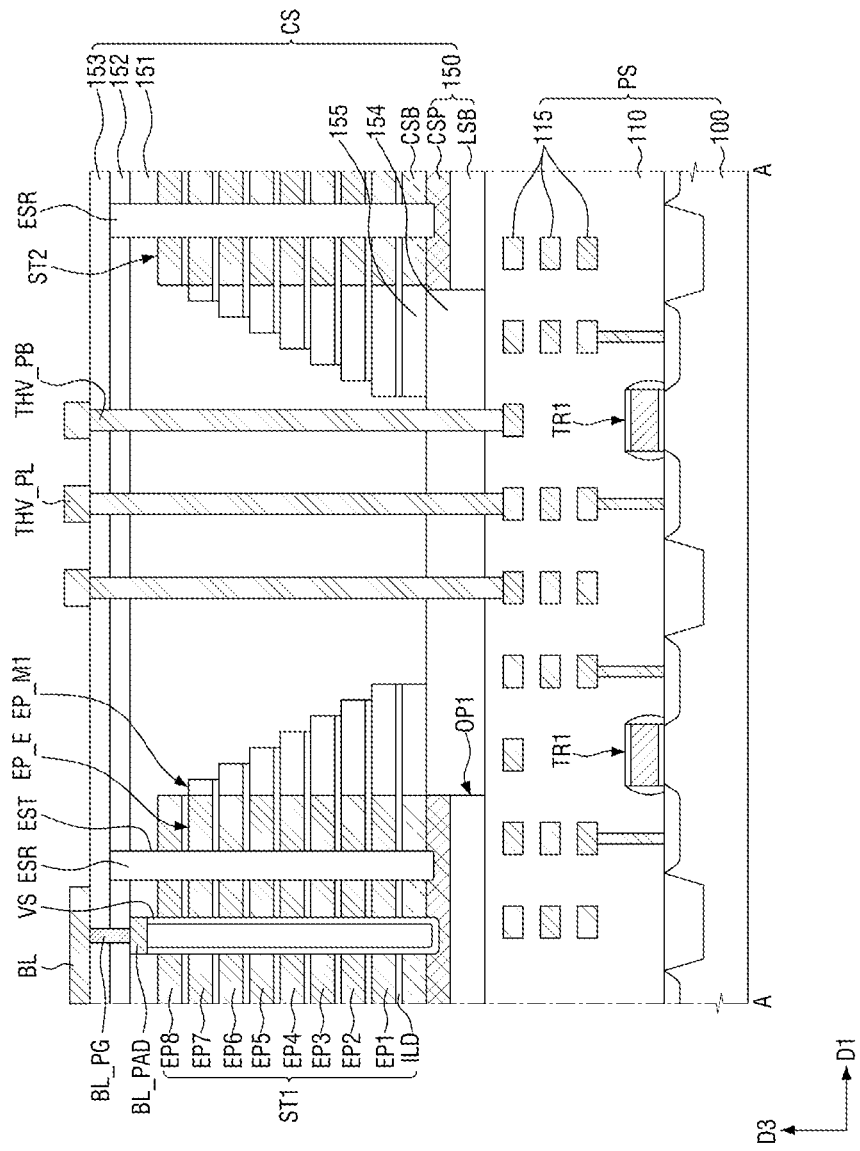
FIG. 11 illustrates a cross-sectional view of a semiconductor memory device according to some embodiments of the present disclosure.

FIG. 11 is a cross-sectional view of a semiconductor memory device according to some embodiments of the present disclosure. The semiconductor memory device of FIG. 11 will hereinafter be described, focusing mainly on the differences with respect to the semiconductor memory device of FIGS. 4 through 9. FIG. 11 corresponds to a cross-sectional view taken along line A-A of FIG. 4.

Referring to FIG. 11, at least one of first through eighth electrode pads EP1 through EP8 may not include first mold regions EP_M1. For example, the eighth electrode pad EP8, which is at the top of a first stack structure ST1, may include an electrode region EP_E, but no first mold regions EP_M1.

Figure 12:
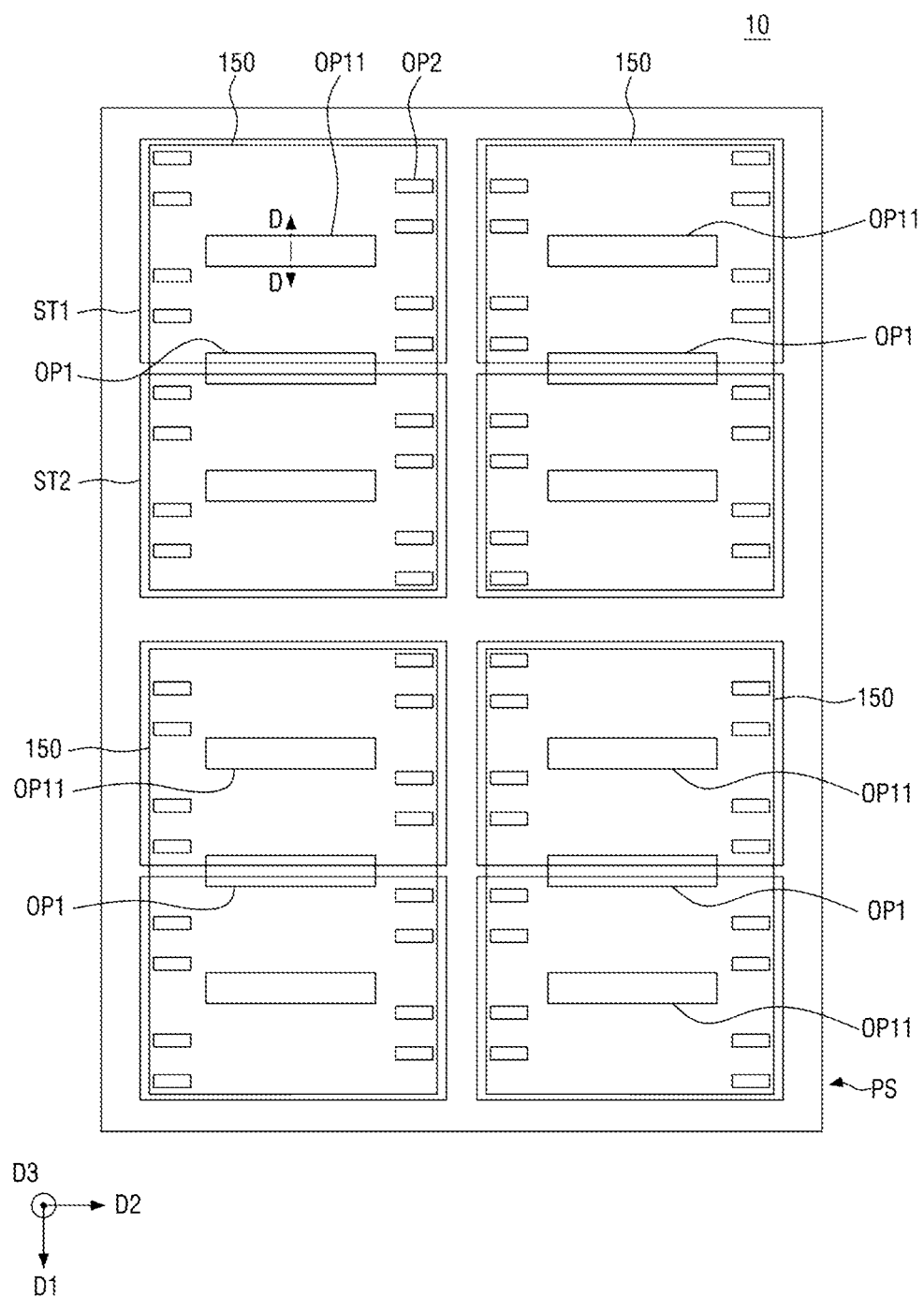
FIG. 12 illustrates a layout view of a semiconductor memory device according to some embodiments of the present disclosure.
Figure 13:
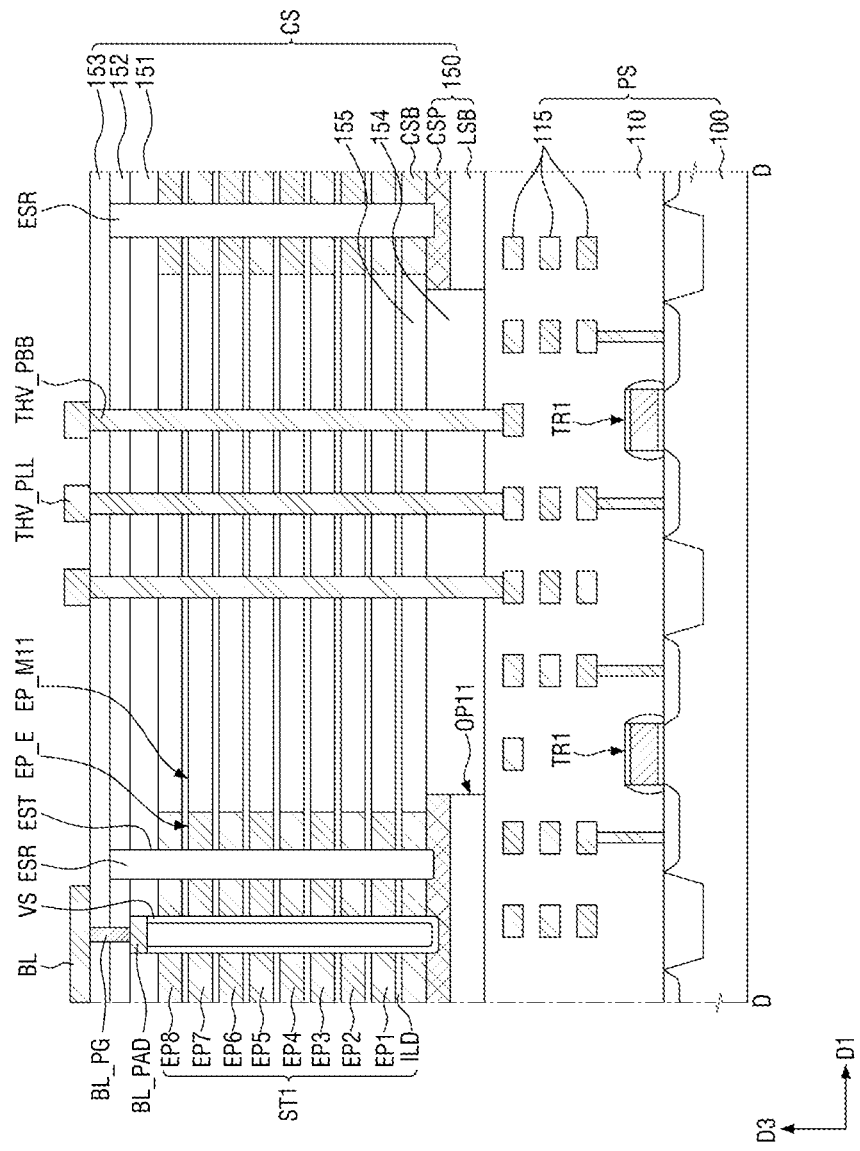
FIG. 13 illustrates a cross-sectional view taken along line D-D of FIG. 12.

FIG. 12 is a layout view of a semiconductor memory device according to some embodiments of the present disclosure. FIG. 13 is a cross-sectional view taken along line D-D of FIG. 12. The semiconductor memory device of FIGS. 12 and 13 will hereinafter be described, focusing mainly on the differences with respect to the semiconductor memory device of FIGS. 4 through 9. It is noted that a cross-sectional view, taken along the first direction D1, of the first and second stack structures ST1 and ST2 with the first opening OP1 interposed therebetween is substantially the same as FIG. 6.

Referring to FIGS. 12 and 13, the horizontal semiconductor layer 150 may further include a (1_1)-th opening OP11 which extends in the second direction D2. The (1_1)-th opening OP11, unlike the first opening OP1, may be generally covered by a first stack structure. That is, the (1_1)-th opening OP11 may not include a part that does not overlap with the first stack structure ST1 in a plan view.

Each of the plurality of first through eighth electrode pads EP1 through EP8 of the first stack structure ST1, which are stacked in the third direction D3, may include a (1_1)-th mold region EP_M11 which is disposed to overlap with the (1_1)-th opening OP11 and extends in the first direction D1.

That is, the (1_1)-th mold region EP_M11 may be disposed between electrode regions EP_E. In other words, the electrode regions EP_E may be disposed on both sides of the (1_1)-th mold region EP_M11 in the first direction D1. The electrode regions EP_E may extend in the first direction D1 from the (1_1)-th mold region EP_M11. The (1_1)-th mold region EP_M11 may be disposed between electrode separation regions ESR which are adjacent to each other in the first direction D1.

A plurality of (1_1)-th through vias THV_PBB which are arranged in the first direction D1 penetrates the first stack structure ST1. The (1_1)-th through vias THV_PBB may be electrically connected to the first peripheral circuits TR1 of the peripheral logic structure PS through the (1_1)-th opening OP11.

The (1_1)-th through vias THV_PBB may be connected to bitlines BL through a (1_1)-th through via connecting wire THV_PLL. The (1_1)-th through vias THV_PBB may penetrate the (1_1)-th mold regions EP_M11 of the first stack structure ST1.

By way of summation and review, embodiments of the present disclosure provide a semiconductor memory device including a vertical channel structure with improved reliability and integration density. That is, embodiments of the present disclosure include a semiconductor memory device having a stack, e.g., a stack of wordlines on a cell array region, with a stair structure, e.g., having a stepped profile, that is in an interior chip area in addition to the stair-type structure at the chip edge. Further, through vias connect the stack with the stair-type structure, e.g., both edge and interior areas, to the peripheral circuits below the chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a peripheral logic structure including first peripheral circuits on a substrate;
   a horizontal semiconductor layer extending along a top surface of the peripheral logic structure;
   a plurality of stack structures arranged on the horizontal semiconductor layer, the plurality of stack structures being adjacent to each other along a first direction; and
   a plurality of electrode separation regions in each of the plurality of stack structures, each of the plurality of electrode separation regions extending lengthwise in a second direction perpendicular to the first direction,
   wherein each of the plurality of stack structures includes:
      a first electrode pad having a first electrode region and a first mold region, and
      a second electrode pad on the first electrode pad, the second electrode pad having a second electrode region and a second mold region,
   wherein the first mold region protrudes in the first direction beyond the second mold region by a first width to define a first stepped profile,
   wherein the first mold region protrudes in the second direction beyond the second mold region by a second width to define a second stepped profile, the second width of the second stepped profile being different from the first width of the first stepped profile, and
   wherein an inter-electrode insulating film is disposed between the first mold region and the second mold region.

2. The semiconductor memory device as claimed in claim 1, wherein the second width is greater than the first width.

3. The semiconductor memory device as claimed in claim 1, wherein the plurality of stack structures includes:
   first and second stack structures which are adjacent to each other along the first direction, facing outer edges of the first and second stack structures being completely separated and spaced apart from each other in the first direction, and
   a plurality of through electrodes extending in a region between the facing outer edges of the first and second stack structures.

4. The semiconductor memory device as claimed in claim 3, wherein the plurality of through electrodes do not penetrate the first and second stack structures.

5. The semiconductor memory device as claimed in claim 3, wherein some of the plurality of through electrodes penetrate an entire thickness of at least one of the first and second stack structures.

6. The semiconductor memory device as claimed in claim 3, wherein:
   the horizontal semiconductor layer includes openings which expose parts of the peripheral logic structure, and
   the plurality of through electrodes extend through the openings to be electrically connected to the first peripheral circuits.

7. The semiconductor memory device as claimed in claim 1, wherein:
   the second electrode pad is at a top of each of the plurality of stack structures.

8. The semiconductor memory device as claimed in claim 1, wherein each of the first and second mold regions extends in the first direction, and the first and second electrode regions are on both sides of the first and second mold regions and extend in the first direction.

9. The semiconductor memory device as claimed in claim 8, further comprising:
   at least one through electrode penetrating the mold regions of the first and second electrode pads,
   wherein the horizontal semiconductor layer includes openings which expose parts of the peripheral logic structure, and
   wherein the at least one through electrode is electrically connected to the first peripheral circuits through the openings.

10. The semiconductor memory device as claimed in claim 1, wherein:
    the first stepped profile and the second stepped profile surround an entire perimeter of each of the plurality of stack structures, as viewed in a top view,
    each of the plurality of stack structures includes a plurality of electrode separation trenches, and
    the plurality of electrode separation regions includes an insulating material that fills the plurality of electrode separation trenches.

11. The semiconductor memory device as claimed in claim 1, further comprising:
    second peripheral circuits in the peripheral logic structure;
    a plurality of first through electrodes arranged between adjacent ones of the plurality of stack structures to be electrically connected to the first peripheral circuits, at least one of the plurality of first through electrodes not penetrating the plurality of stack structures; and
    a plurality of second through electrodes electrically connected to the second peripheral circuits through the first stack structure and arranged along the second direction.

12. The semiconductor memory device as claimed in claim 11, wherein the plurality of first through electrodes does not penetrate the plurality of stack structures.

13. The semiconductor memory device as claimed in claim 11, wherein:
    the plurality of electrode separation regions includes first and second electrode separation regions spaced apart from each other in the first direction, and
    vertical structures are positioned between the first and second electrode separation regions, the vertical structures penetrating each of the plurality of stack structures, and the first stepped profile and the second stepped profile being arranged to surround an entire perimeter of each of the plurality of stack structures, as viewed in a top view.

14. The semiconductor memory device as claimed in claim 11, wherein:
  the plurality of electrode separation regions includes first and second electrode separation regions which are the most apart from each other in the first direction,
  the first and second electrode regions are between the first and second electrode separation regions, and the first and second mold regions extend in the first direction from the first and second electrode regions, and
  each of the plurality of stack structures has the first stepped profile defined by the first and second mold regions of the first electrode pad and the second electrode pad.

15. The semiconductor memory device as claimed in claim 1, wherein:
  the first mold region extends from and is colinear with the first electrode region in each of the first direction and the second direction, and
  the plurality of second through electrodes penetrate the mold region.

16. The semiconductor memory device as claimed in claim 11, further comprising:
  a plurality of vertical structures between the plurality of electrode separation regions, which are adjacent to one another, to penetrate each of the plurality of stack structures and to be electrically connected to the horizontal semiconductor layer; and
  bitlines on the plurality of stack structures to extend in the second direction and to be connected to at least one of the plurality of vertical structures,
  the plurality of first through electrodes penetrating openings in the horizontal semiconductor layer and connecting the bitlines and the first peripheral circuits.

17. The semiconductor memory device as claimed in claim 16, wherein:
  all of the plurality of vertical structures is between the plurality of electrode separation regions, and
  the plurality of first through electrodes and the plurality of second through electrodes are peripheral to the plurality of vertical structures.

* * * * *